(12) United States Patent
Park et al.

(10) Patent No.: US 12,027,416 B2
(45) Date of Patent: Jul. 2, 2024

(54) BEOL ETCH STOP LAYER WITHOUT CAPACITANCE PENALTY

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (CN); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 17/476,521

(22) Filed: Sep. 16, 2021

(65) Prior Publication Data
US 2023/0080438 A1 Mar. 16, 2023

(51) Int. Cl.
*H01L 21/768* (2006.01)
*H01L 23/522* (2006.01)

(52) U.S. Cl.
CPC .. *H01L 21/76829* (2013.01); *H01L 21/76816* (2013.01); *H01L 21/76841* (2013.01); *H01L 23/5222* (2013.01); *H01L 23/5226* (2013.01)

(58) Field of Classification Search
CPC . H01L 23/5226; H01L 23/525; H01L 23/528; H01L 23/5283; H01L 23/535; H01L 21/76829; H01L 21/76832; H01L 21/76834; H01L 21/76846; H01L 21/76816; H01L 23/5329; H01L 23/52395
See application file for complete search history.

(56) References Cited

U.S. PATENT DOCUMENTS

| | | |
|---|---|---|
| 6,525,428 B1 | 2/2003 | Ngo |
| 6,720,245 B2 | 4/2004 | Stucchi et al. |
| 7,442,637 B2 | 10/2008 | Su |
| 7,443,029 B2 | 10/2008 | Lin |
| 8,089,135 B2 | 1/2012 | Lindgren |
| 8,450,212 B2 | 5/2013 | Angyal |
| 8,669,181 B1 | 3/2014 | Yu |
| 8,815,743 B2 | 8/2014 | Birner |
| 8,907,458 B2 | 12/2014 | Ponoth |
| 9,520,395 B2 | 12/2016 | Bouche |
| 10,453,700 B2 | 10/2019 | Jiang |
| 10,629,480 B2 | 4/2020 | Chen |
| 2003/0003404 A1* | 1/2003 | Lee ............. H01L 21/76829 430/311 |
| 2005/0106858 A1 | 5/2005 | Cheng |
| 2005/0258542 A1 | 11/2005 | Fuller |
| 2006/0244146 A1* | 11/2006 | Colburn ........ H01L 21/76807 257/E21.579 |
| 2014/0084465 A1* | 3/2014 | Zhang .......... H01L 21/76831 257/E23.011 |
| 2015/0262912 A1* | 9/2015 | Ting ............. H01L 21/76807 438/666 |
| 2022/0319989 A1* | 10/2022 | Li ................ H01L 23/5222 |
| 2023/0060269 A1* | 3/2023 | Hsueh .......... H01L 21/76897 |

FOREIGN PATENT DOCUMENTS

EP 2884542 A2 6/2015

* cited by examiner

*Primary Examiner* — Thanhha S Pham
(74) *Attorney, Agent, or Firm* — Gavin Giraud (57) ABSTRACT

An etch stop layer is located on top of a first dielectric layer. A conductive line is located on top of the etch stop layer. A second dielectric layer is located above the first dielectric layer. The second dialect layer is in contact with the first dielectric layer.

14 Claims, 7 Drawing Sheets

BEOL ETCH STOP LAYER WITHOUT CAPACITANCE PENALTY

BACKGROUND OF THE INVENTION

The present invention relates generally to the field of semiconductor device manufacture and more particularly to using a back end of line (BEOL) etch stop layer without capacitance penalty.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

The BEOL is the second portion of the IC fabrication process. Here, the individual pieces, including but not limited to transistors, capacitors, resistors, etc., are interconnect on the wafer. The BEOL part of fabrication stage contacts, interconnect wires, vias and dielectric structures are formed.

SUMMARY

Embodiments of the present invention provide for a semiconductor structure. In an embodiment, an etch stop layer is located on top of a first dielectric layer. A conductive line is located on top of the etch stop layer. A second dielectric layer is located above the first dielectric layer. The second dialect layer is in contact with the first dielectric layer.

In an embodiment, a first dielectric layer on top of and in contact with a substrate layer. Two or more trenches surrounded by the first dielectric layer. A capping layer on top of the first dielectric layer and the two or more trenches. A second dielectric layer on top of at least a portion of the capping layer. An etch stop layer on top of at least a portion of the first dielectric layer. A conductive line on top of the first dielectric layer. A second dielectric layer on top of the first dielectric layer.

Embodiments of the present invention provide for a method of forming a semiconductor structure. In an embodiment, a first dielectric layer is deposited on top of a substrate. Two or more trenches are etched into the first dielectric layer. Each trench of the two or more trenches includes a barrier layer deposited within the trench and in contact with the first dielectric layer, a liner layer deposited within and in contact with the barrier layer, and a metal layer deposited within and in contact with the liner layer. A capping layer is deposited on top of and in contact with the first dielectric layer and the two or more trenches. A second dielectric layer is deposited on top of and in contact with the capping layer. An etch stop layer is deposited on top of and in contact with the second dielectric layer. A third dielectric layer is deposited on top of the etch stop layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that the control of trench and via depth is critical in semiconductor fabrication. Embodiments of the present invention recognize that trench depth variation due to loading effect is getting worse as BEOL pitch scales down. Thus, as there is a deeper trench at wider pitch than narrower pitch, there is higher line resistance in narrow pitch or higher capacitance in wider pitch. Embodiments of the present invention recognize that there is a capacitance penaltyi8n coming from etch stop layers, which have a higher dielectric constant than low-k dielectric layers.

Embodiments of the present invention provide for uniform trench depth regardless of line width without paying capacitance penalty. Embodiments of the present invention provide for using etch stop layer to define trench depth but removing it later to prevent higher capacitance. Embodiments of the present invention provide for all trenches having the same depth. Embodiments of the present invention provide for no and/or negligible capacitance penalty. Embodiments of the present invention provide for a fresh low-k dielectric layer that has no plasma damage.

Embodiments of the present invention provide for an etch stop layer that can have an adjusted thickness depending on etch selectively. Embodiments of the present invention provide for breakthrough of the etch stop layer being done by either wet or dry etching depending on the material used for the etch stop layer. Embodiments of the present invention provide for an etch stop layer than can either be dielectric in nature (i.e., SiN, AlOx, etc.) or metal (i.e., TiN, TaN, etc.) which will have a very high etch selectively relative to the low-k dielectric layer.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-8 depict a structure and method of using a BEOL etch stop layer without capacitance penalty, in accordance with a first embodiment of the invention.

Figure 1:
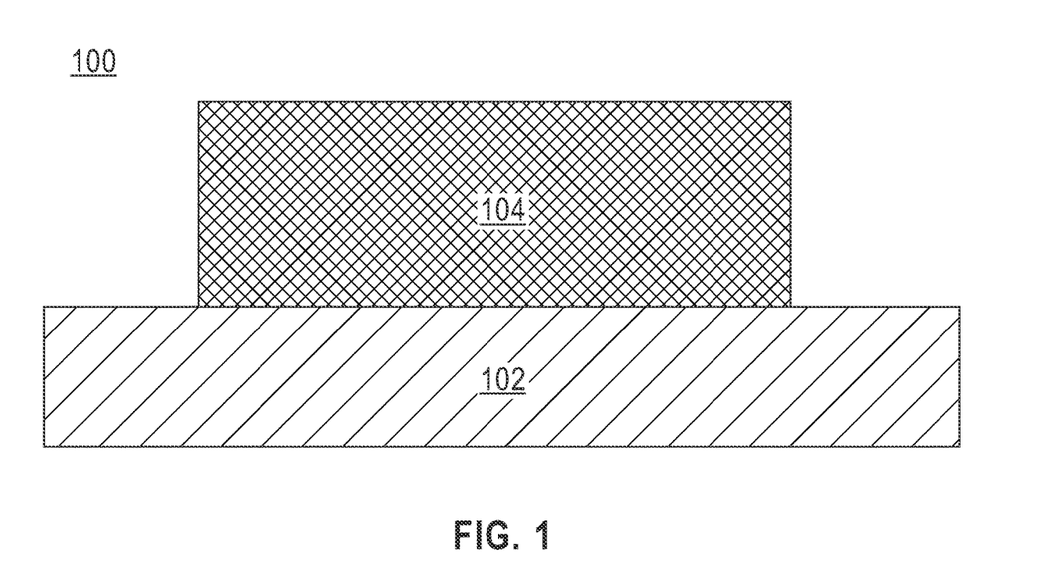
FIG. 1 depicts a cross-sectional view of a semiconductor structure with a first low-k dielectric layer deposited on a substrate in accordance with a first embodiment of the present invention.

FIG. 1 depicts a cross-sectional view of a semiconductor structure 100 with a first low-k dielectric layer 104 deposited on a substrate 102 in accordance with a first embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, and Ga. In an embodiment, substrate 102 may be a level of interconnect wiring located below first low k dielectric layer 104. For example, modern semiconductor chips may have fifteen or more levels of interconnect wiring, labeled M1-M15, so if this structure was to be used at the M2 metal level, in other words M2 metal level is formed as first metal layer in low-k dielectric layer 104, then the M1 metal level would be located below it. In an embodiment, the first low-k dielectric layer 104 may be any insulator having a dielectric constant of less than silicon dioxide, i.e., less than about 4.0. In an alternative embodiment, the first low-k dielectric layer 104 may have a dielectric constant of less than 3.5. In an embodiment, the first low-k dielectric layer 104 may be deposited and formed using known dielectric material deposition methods.

Figure 2:
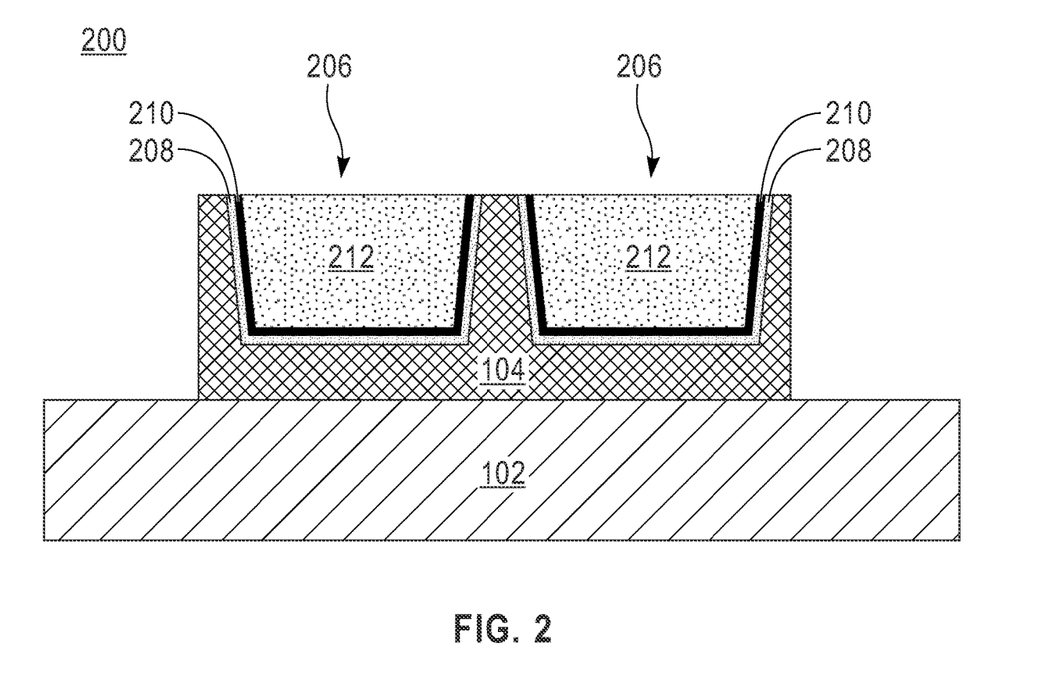
FIG. 2 depicts a cross-sectional view of the semiconductor structure with two trenches etched in the first low-k dielectric layer along with barrier layer, liner layer, and metal layer deposition within the trenches in accordance with a first embodiment of the present invention.

FIG. 2 depicts a cross-sectional view of the semiconductor structure 200 with two trenches 206 etched in the first low-k dielectric layer 104 along with barrier layer 208, liner layer 210, and metal layer 212 deposition within the trenches in accordance with a first embodiment of the present invention. As depicted, FIG. 2 shows a first low-k dielectric layer 104 is etched to form trenches 206. In an embodiment, two trenches are formed. In an alternative embodiment, any number of trenches may be formed. In an embodiment, a barrier layer 208 is deposited within the trenches 206 on top of the first low-k dielectric layer 104 via sputtering, ALD, CVD, or any other process known in the art. In an embodiment, barrier layer 208 may be TaN, Ta, TiN, WN, MnN, or any other material known in the art. In an embodiment, barrier layer 208 may range in thickness from 0.5 nm to 5 nm. In an embodiment, a liner layer 210 is deposited on top of the barrier layer 208 via sputtering, ALD, CVD, or any other process known in the art. In an embodiment, liner layer 210 is Ru, Co, or any other material known in the art. In an embodiment, liner layer 210 may range in thickness from 0.5 nm to 5 nm. In an embodiment, a metal layer 212 is formed within trenches 206 on top of the liner layer 210 and at least to the height of the remaining first low-k dielectric layer 104. In an embodiment, the metal layer 212 is deposited using electroplating (ECP), PVD, CVD, ALD or any other process known in the art. In an embodiment, metal layer 212 is Cu, Ru, W, Mo, Ir, Rh or any other material known in the art. In an embodiment, metal layer 212, liner layer 210, barrier layer 208 and/or first low-k dielectric layer 104 are leveled and cleaned using chemical mechanical polishing (CMP). In an embodiment, there is a planarization step after the deposition of the barrier layer 208, liner layer 210, and metal layer 212.

Figure 3:
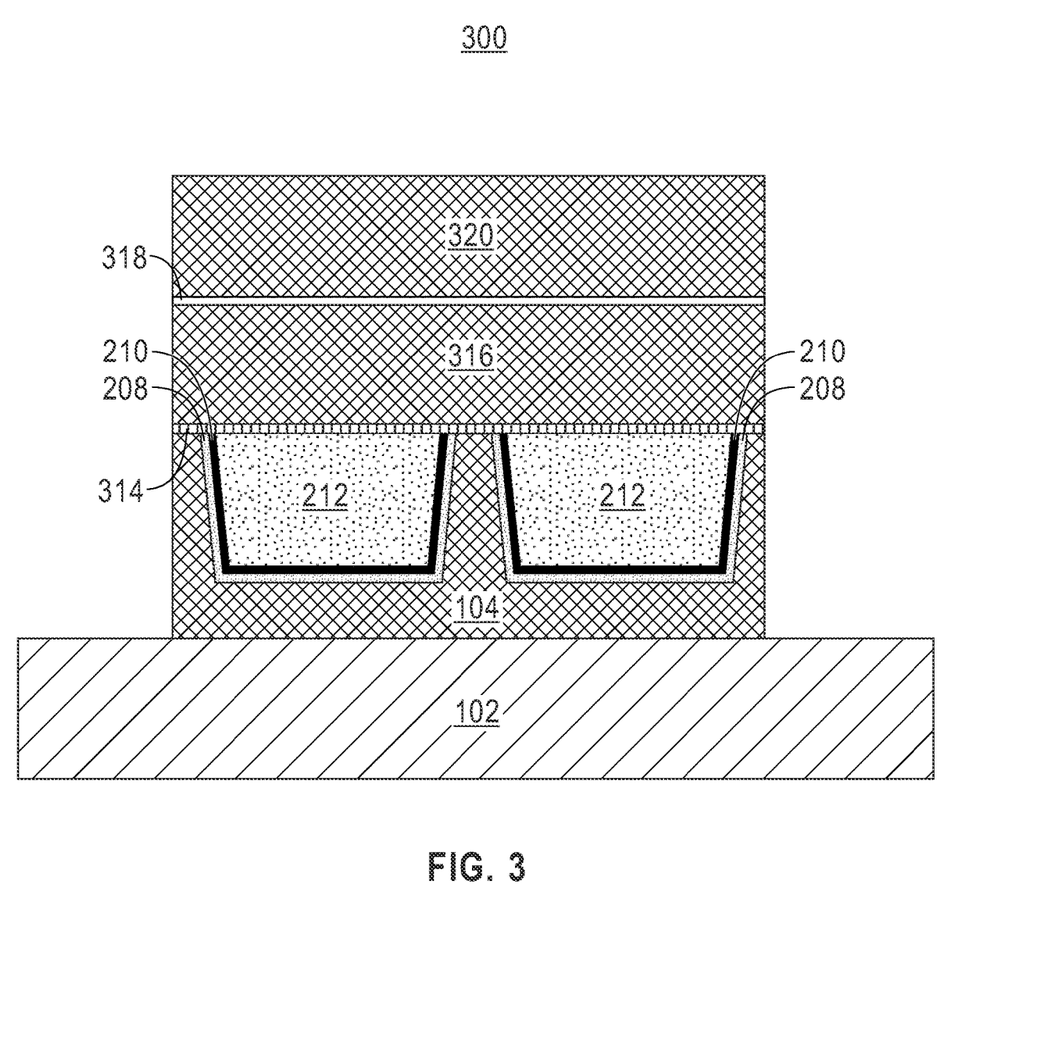
FIG. 3 depicts a cross-sectional view of the semiconductor structure after depositing a capping layer on top of the semiconductor structure, depositing a second low-k dielectric layer on top of the capping layer, depositing a etch stop layer on top of the second low-k dielectric layer, and third low-k dielectric layer on top of the etch stop layer in accordance with a first embodiment of the present invention.

FIG. 3 depicts a cross-sectional view of the semiconductor structure 300 after depositing a capping layer 314 on top of the semiconductor structure 200, depositing a second low-k dielectric layer 316 on top of the capping layer 314, depositing a etch stop layer 318 on top of the second low-k dielectric layer 316, and third low-k dielectric layer 320 on top of the etch stop layer 318 in accordance with a first embodiment of the present invention. As depicted, FIG. 3 includes a capping layer 314 deposited on top of the metal layer 212, liner layer 210, barrier layer 208. In an embodiment, the capping layer 314 may be SiCN, or any other material known in the art. In an embodiment, the capping layer 314 maybe deposited using PVD, CVD, ALD, or any other process known in the art. In an embodiment, capping layer 314 may range in thickness from 1 nm to 10 nm. As depicted, FIG. 3 includes a second low-k dielectric layer 316 deposited upon the capping layer 314. In an embodiment, the second low-k dielectric layer 316 may be any insulator having a dielectric constant of less than silicon dioxide, i.e., less than about 4.0. In an alternative embodiment, the second low-k dielectric layer 316 may have a dielectric constant of less than 3.5. In an embodiment, the second low-k dielectric layer 316 may be deposited and formed using known dielectric material deposition, planarization (optional), and etch processes for semiconductor manufacture. In an embodiment, second low-k dielectric layer 316 ranges in thickness from 10 nm to 50 nm. In an embodiment, the etch stop layer 318 may be SiN, AlO, AN, SiCN, STAIN, or any other etch stop material known in the art. In an embodiment, etch stop layer 318 may range in thickness from 1 nm to 10 nm. As depicted, FIG. 3 includes a third low-k dielectric layer 320 deposited upon the etch stop layer 318. In an embodiment, the third low-k dielectric layer 320 may be any insulator having a dielectric constant of less than silicon dioxide, i.e., less than about 4.0. In an alternative embodiment, the third low-k dielectric layer 320 may have a dielectric constant of less than 3.5. In an embodiment, the third low-k dielectric layer 320 may range in thickness from 10 nm to 80 nm.

Figure 4:
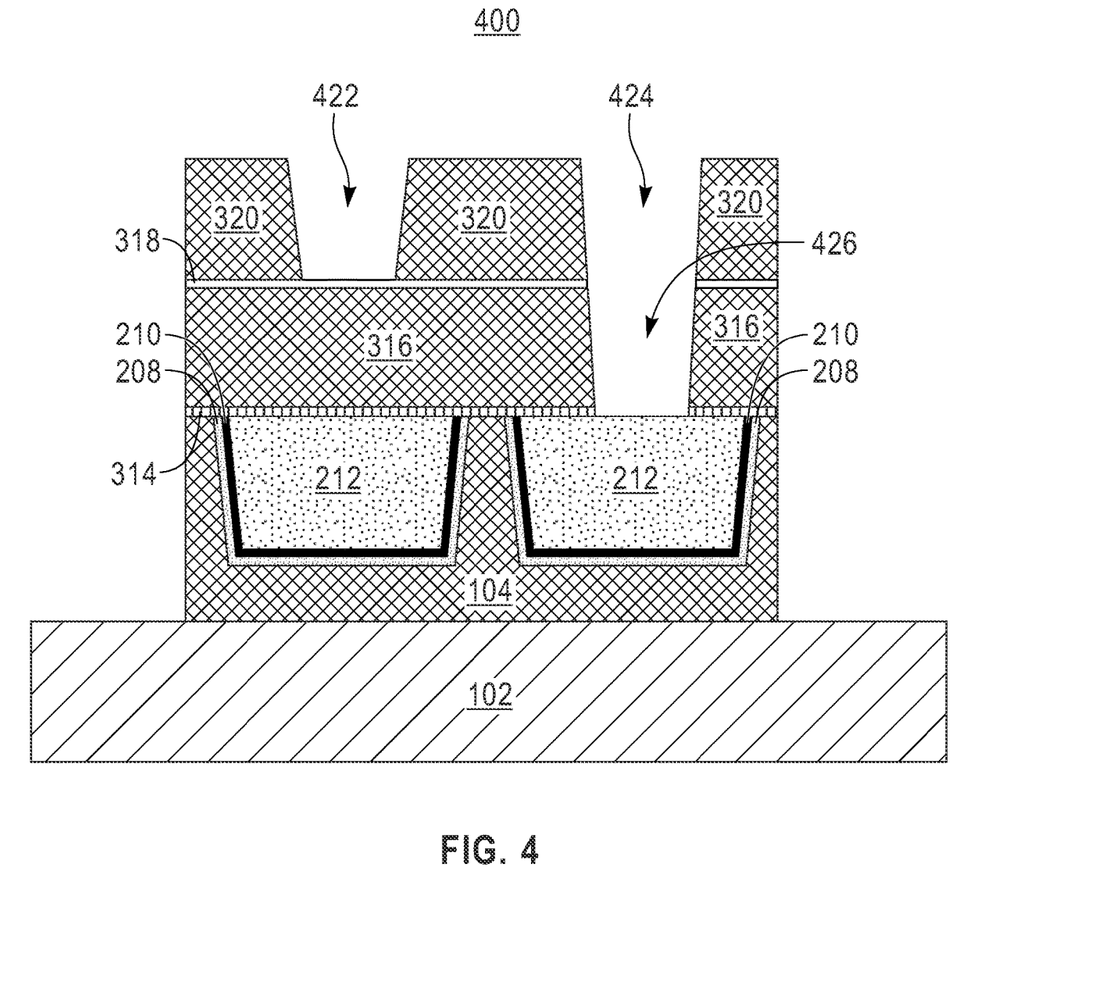
FIG. 4 depicts a cross-sectional view of the semiconductor structure after patterning a first upper level trench into the third low-k dielectric layer, patterning a second upper level trench into the third low-k dielectric layer, and patterning a via into the second low-k dielectric layer in accordance with a first embodiment of the present invention.

FIG. 4 depicts a cross-sectional view of the semiconductor structure 400 after patterning a first upper level trench 422 into the third low-k dielectric layer 320, patterning a second upper level trench 424 into the third low-k dielectric layer 320, and patterning a via 426 into the second low-k dielectric layer 316 in accordance with a first embodiment of the present invention. As depicted, FIG. 4 includes a first upper level trench 422 is patterned into the third low-k dielectric layer 320, a second upper level trench 424 is patterned into the third low-k dielectric layer 320, and via 426 is patterned into the second low-k dielectric layer 316. In an embodiment, the first upper level trench 422, the second upper level trench 424, and/or the via 426 may be patterned using any known removal technique known in the art, such as, for example, wet etching, reactive ion etching or any combination thereof. In an embodiment, the first upper level trench 422 depth stops at etch stop layer 318. In an embodiment, the first upper level trench 422 an second upper level trench 424 have the same depth. In an embodiment, the via 426 depth stops at metal layer 212.

Figure 5:
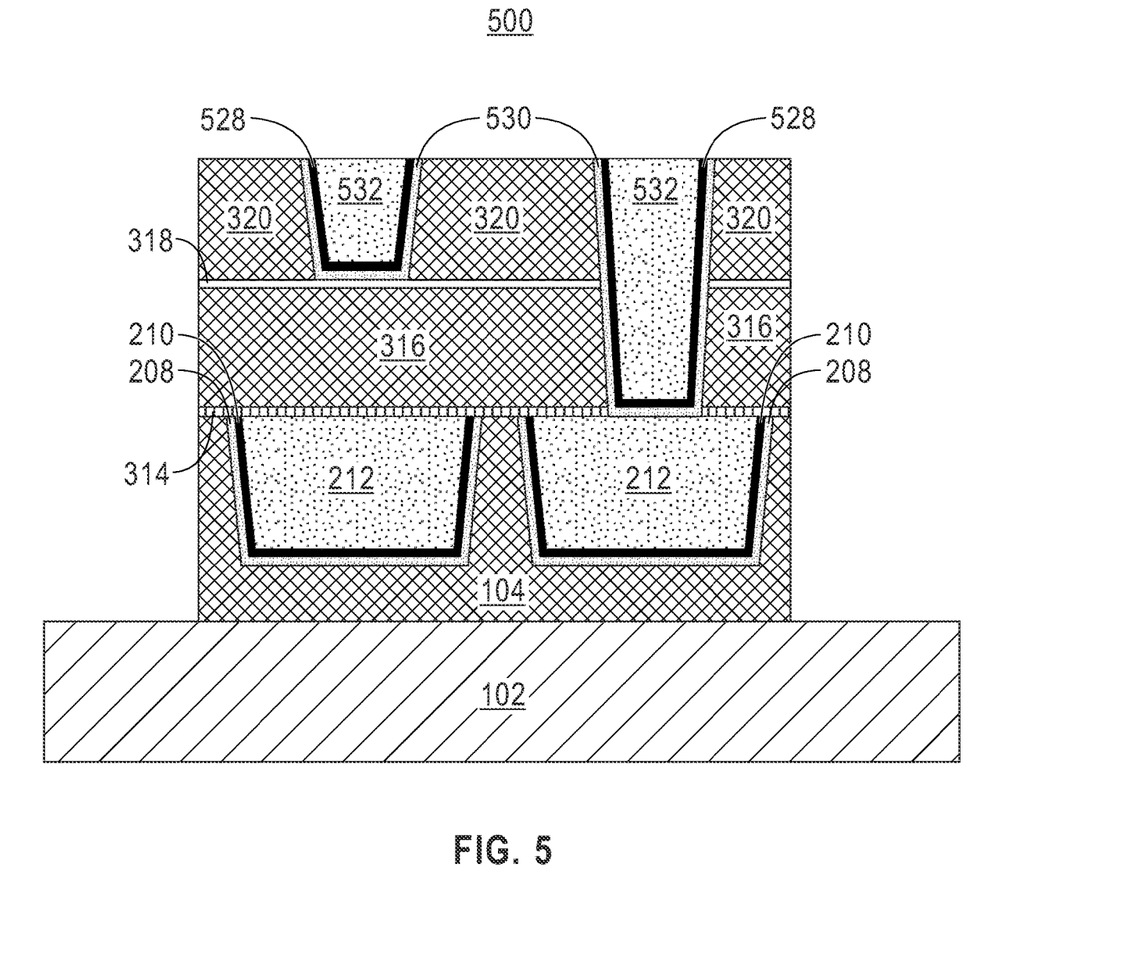
FIG. 5 depicts a cross-sectional view of the semiconductor structure after depositing a liner layer and barrier layer within the first upper level trench, the second upper level trench and the via and depositing a metal layer on top of the liner layer in accordance with a first embodiment of the present invention.

FIG. 5 depicts a cross-sectional view of the semiconductor structure 500 after depositing a barrier layer 530 and a liner layer 528 within the first upper level trench 422, the second upper level trench 424 and the via 426 and depositing a metal layer 532 on top of the liner layer 528 in accordance with a first embodiment of the present invention. In an embodiment, metal layer 532 is a conductive line. As depicted, FIG. 5 includes a barrier layer 530 deposited in the first upper level trench 422, second upper level trench 424, and via 426 via sputtering or any other process known in the art. In an embodiment, in the scenario with only the first upper level trench 422, the barrier layer 530 is deposited on top of the third low-k dielectric layer 320 and the exposed etch stop layer 318. In an embodiment, in the scenario with the second upper level trench 424 and via 426, the barrier layer 530 is deposited on top of the third low-k dielectric layer 320, exposed etch stop layer 318, second low-k dielectric layer 316, capping layer 314, and metal layer 212, In an embodiment, barrier layer 530 is TaN, Ta, TiN, WN, or any other material known in the art. In an embodiment, barrier layer 530 is deposited via sputtering, ALD, CVD, or any other process known in the art. In an embodiment, barrier layer 530 may range from 0.5 nm to 5 nm in thickness. In an embodiment, a liner layer 528 is deposited on top of the barrier layer 530 via sputtering, ALD, CVD, or any other process known in the art. In an embodiment, liner layer 528 is Ru, Co, or any other material known in the art. In an embodiment, liner layer 528 may range in thickness from 0.5 nm to 5 nm. In an embodiment, a metal layer 532 is formed within first upper level trench 422, second upper level trench 424, and via 426 on top of the liner layer 528 and at least to the height of the third low-k dielectric layer 320. In an embodiment, the metal layer 532 is deposited using ECP, PVD, CVD, ALD, or any other process known in the art. In an embodiment, metal layer 212 is Cu, Ru, W, Mo, Ir, Rh or any other material known in the art. In an embodiment, metal layer 532, barrier layer 530, liner layer 528 and/or third low-k dielectric layer 320 are leveled and cleaned using chemical mechanical polishing (CMP).

Figure 6:
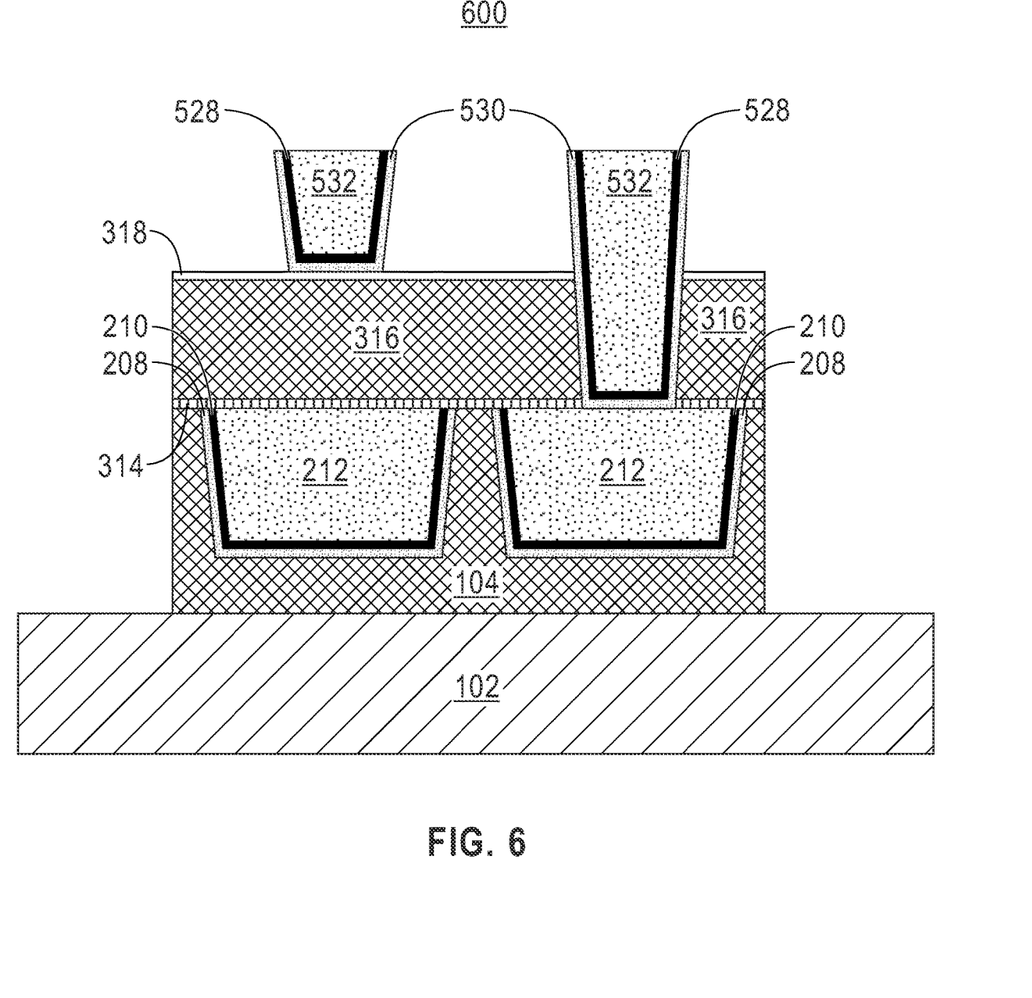
FIG. 6 depicts a cross-sectional view of the semiconductor structure after removal of the third low-k dielectric layer in accordance with a first embodiment of the present invention.

FIG. 6 depicts a cross-sectional view of the semiconductor structure 600 after removal of the third low-k dielectric layer 320 in accordance with a first embodiment of the present invention. As depicted, FIG. 6. includes the third low-k dielectric layer 320 being removed. In an embodiment, the third low-k dielectric layer 320 may be removed using any known removal technique known in the art, such as, for example, wet etching, reactive ion etching or any combination thereof. In an embodiment, the etch stop layer 318 is the stop point for removal of the third low-k dielectric layer 320.

Figure 7:
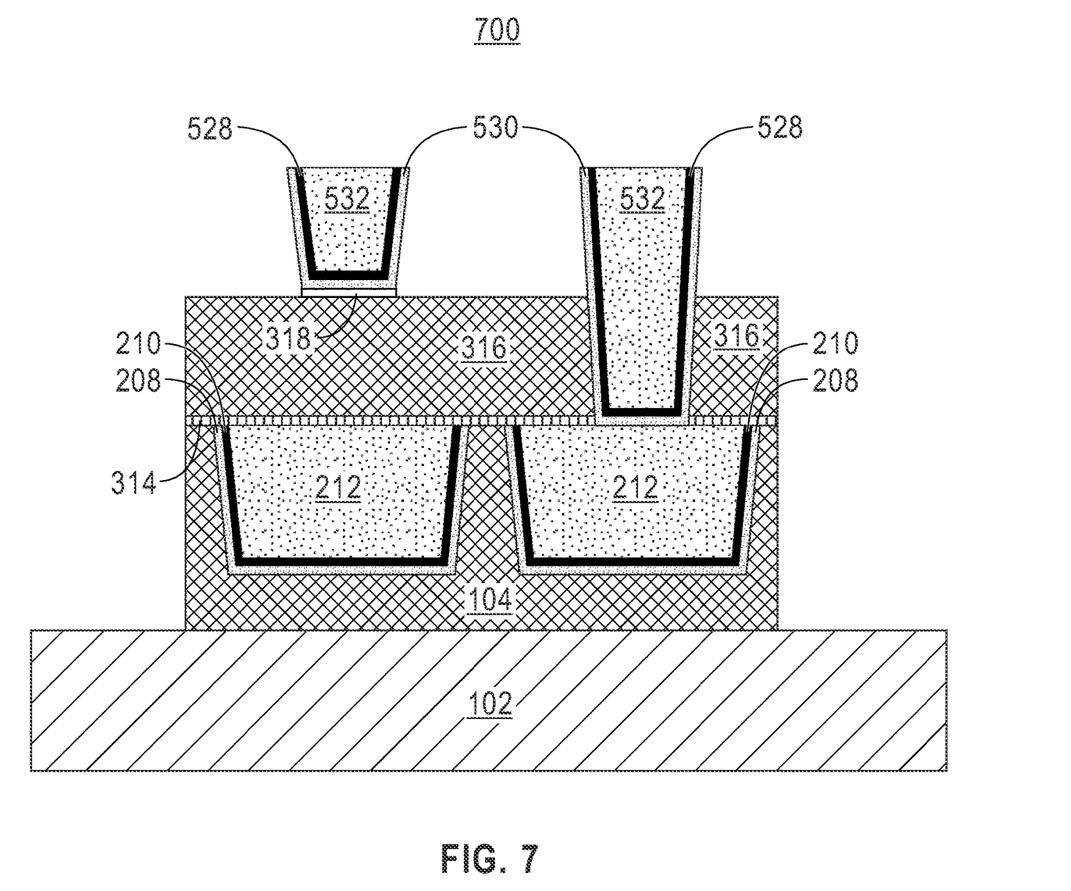
FIG. 7 depicts a cross-sectional view of the semiconductor structure after removal of the exposed portions of the etch stop layer in accordance with a first embodiment of the present invention.

FIG. 7 depicts a cross-sectional view of the semiconductor structure 700 after removal of the exposed portions of the etch stop layer 318 in accordance with a first embodiment of the present invention. As depicted, FIG. 7 includes removal of the exposed portions of the etch stop layer 318. In an embodiment, the etch stop layer 318 may be removed any known removal technique known in the art, such as, for example, wet etching, reactive ion etching or any combination thereof. In an embodiment, the etch stop layer 318 below the liner layer 530 of the first upper level trench 422 remains.

Figure 8:
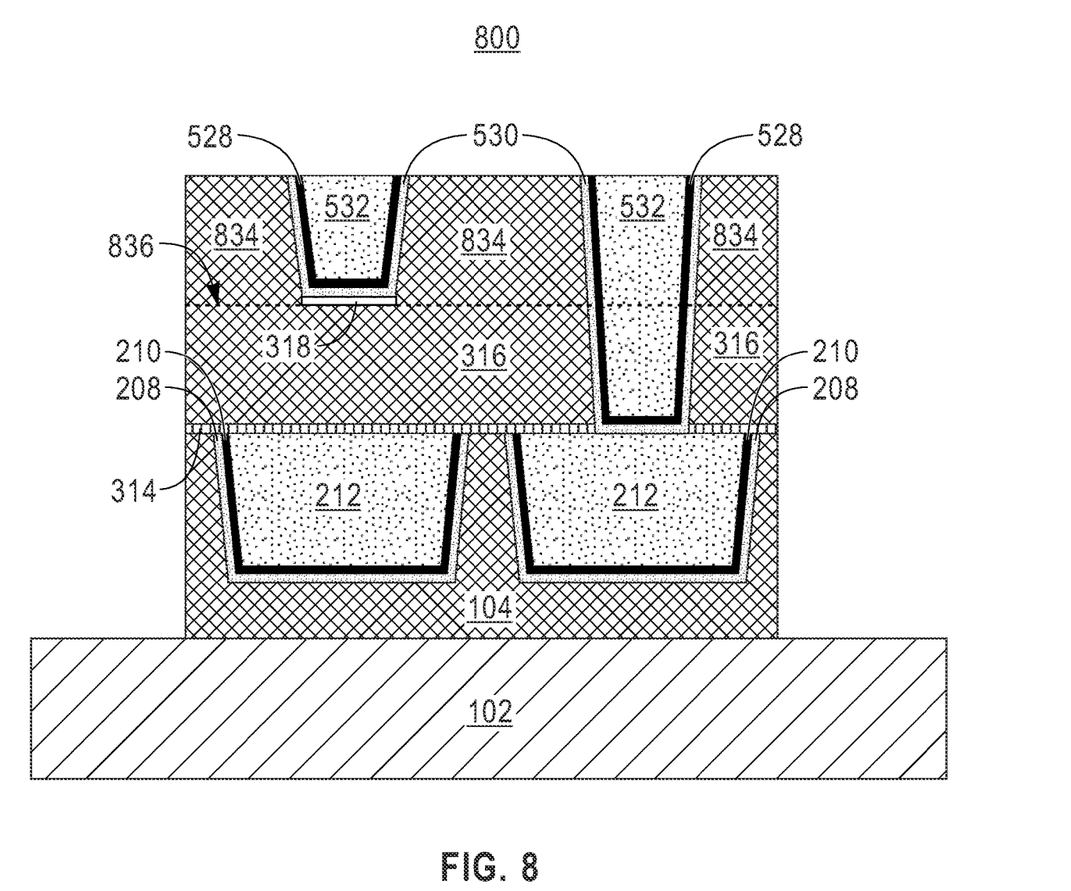
FIG. 8 depicts a cross-sectional view of the semiconductor structure after depositing a fourth low-k dielectric layer upon the second low-k dielectric layer and around the liner layer in accordance with a first embodiment.

FIG. 8 depicts a cross-sectional view of the semiconductor structure 800 after depositing a fourth low-k dielectric layer 834 upon the second low-k dielectric layer 316 and around the liner layer 530 in accordance with a first embodiment. As depicted, FIG. 8 includes a fourth low-k dielectric layer 834 deposited upon the second low-k dielectric layer 316 and around liner layer 530. Dashed line 836 shows a differentiation between the second low-k dielectric layer 316 (original) and a fourth low-k dielectric layer 834 (new) but it should be noted dashed line 836 is for visualization purposes only. In an embodiment, the fourth low-k dielectric layer 834 may be any insulator having a dielectric constant of less than silicon dioxide, i.e., less than about 4.0. In an alternative embodiment, the fourth low-k dielectric layer 834 may have a dielectric constant of less than 3.5. In an embodiment, the fourth low-k dielectric layer 834 may be deposited and formed using known metal and dielectric material deposition, planarization (optional), and etch processes for semiconductor manufacture.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
an etch stop layer located on top of a first dielectric layer;
a first conductive line located on top of the etch stop layer, wherein the etch stop layer extends only in an area directly below the conductive line;
a second dielectric layer contacting a top of the first dielectric layer; and
a second conductive line protruding through the second dielectric layer and the first dielectric layer.

2. The semiconductor structure of claim 1, wherein the second dielectric layer laterally surrounds the etch stop layer and the conductive line.

3. The semiconductor structure of claim 1, wherein the conductive line comprises a liner layer, a barrier layer, and a metal layer.

4. The semiconductor structure of claim 3, wherein the etch stop layer directly contacts the barrier layer.

5. The semiconductor structure of claim 3, wherein the metal layer is on top of and in contact with the liner layer and the liner layer is on top of and in contact with the barrier layer.

6. The semiconductor structure of claim 1, wherein the first dielectric layer and the second dielectric layer have a dielectric constant of less than 4.0.

7. The semiconductor structure of claim 1, wherein the etch stop layer is selected from the group consisting of SiN, AlO, AlN, SiCN, SiAlN.

8. A semiconductor structure comprising:
a first dielectric layer on top of and in contact with a substrate layer;
two or more trenches surrounded by the first dielectric layer;
a capping layer on top of the first dielectric layer and the two or more trenches;
a second dielectric layer on top of at least a portion of the capping layer;
an etch stop layer;
a conductive line on top of the second dielectric layer; and
a third dielectric layer on top of the second dielectric layer, wherein the etch stop layer extends only in an area directly below the conductive line and above the second dielectric layer, and the second dielectric layer contacts the third dielectric layer.

9. The semiconductor structure of claim 8, wherein the third dielectric layer laterally surrounds the etch stop layer and the conductive line.

10. The semiconductor structure of claim 8, wherein the conductive layer comprises liner layer, barrier layer, and a metal layer.

11. The semiconductor structure of claim 10, wherein the etch stop layer is in touch with the barrier layer.

12. The semiconductor structure of claim 10, wherein the metal layer is on top of and in contact with the liner layer and the liner layer is on top of and in contact with the barrier layer.

13. The semiconductor structure of claim 8, wherein the first dielectric layer has a dielectric constant of less than 4.0.

14. The semiconductor structure of claim 8, wherein the etch stop layer is selected from the group consisting of SiN, AlO, AlN, SiCN, SiAlN.

* * * * *